United States Patent
Jung et al.

(10) Patent No.: US 11,367,399 B2
(45) Date of Patent: Jun. 21, 2022

(54) DISPLAY PANEL AND DISPLAY DEVICE

(71) Applicant: LG DISPLAY CO., LTD., Seoul (KR)

(72) Inventors: Insang Jung, Gyeonggi-do (KR); KumMi Oh, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/523,421

(22) Filed: Jul. 26, 2019

(65) Prior Publication Data

US 2020/0203382 A1 Jun. 25, 2020

(30) Foreign Application Priority Data

Dec. 19, 2018 (KR) .......................... 10-2018-0165270

(51) Int. Cl.

| G09G 3/3266 | (2016.01) |
| H01L 27/12 | (2006.01) |
| G09G 3/20 | (2006.01) |
| H01L 25/18 | (2006.01) |
| G09G 3/3233 | (2016.01) |
| H01L 27/32 | (2006.01) |

(52) U.S. Cl.
CPC ............ *G09G 3/3266* (2013.01); *G09G 3/20* (2013.01); *G09G 3/3233* (2013.01); *H01L 25/18* (2013.01); *H01L 27/124* (2013.01); *G09G 2300/026* (2013.01); *G09G 2300/0408* (2013.01); *G09G 2300/0426* (2013.01); *H01L 27/1225* (2013.01); *H01L 27/3276* (2013.01)

(58) Field of Classification Search
None
See application file for complete search history.

(56) References Cited

U.S. PATENT DOCUMENTS

| 10,706,766 | B2* | 7/2020 | Kim ..................... H01L 25/167 |
| 2008/0225195 | A1 | 9/2008 | Oohara et al. |
| 2010/0283931 | A1* | 11/2010 | Horiuchi ............... G02F 1/1345 349/46 |
| 2012/0293471 | A1* | 11/2012 | Yoshida ............... G02F 1/13458 345/205 |
| 2013/0146931 | A1* | 6/2013 | Liu ..................... H01L 27/1262 257/99 |
| 2013/0277650 | A1* | 10/2013 | Yoneya ............... H01L 27/3276 257/40 |
| 2015/0187810 | A1* | 7/2015 | Lee .......................... G02F 1/167 349/42 |
| 2015/0279918 | A1* | 10/2015 | Teraguchi ........... H01L 27/3276 257/40 |

(Continued)

FOREIGN PATENT DOCUMENTS

| CN | 101553086 A | 10/2009 |
| CN | 101636689 A | 1/2010 |

(Continued)

*Primary Examiner* — Benjamin X Casarez
(74) *Attorney, Agent, or Firm* — Birch, Stewart, Kolasch & Birch, LLP

(57) ABSTRACT

A display panel can include a first plate; a second plate disposed on the first plate; a first layer stack disposed between the first plate and the second plate; a first transistor disposed within the first layer stack; a second layer stack disposed on the second plate; and a second transistor disposed within the second layer stack, in which the first transistor is disposed in a location overlapping with an active area corresponding to an image display area.

15 Claims, 14 Drawing Sheets

(56) References Cited

U.S. PATENT DOCUMENTS

| | | | |
|---|---|---|---|
| 2016/0349567 A1 | 12/2016 | Kwon et al. | |
| 2017/0329189 A1* | 11/2017 | Kim | G02F 1/13454 |
| 2018/0012549 A1* | 1/2018 | Lee | H01L 27/3276 |
| 2018/0151654 A1* | 5/2018 | Lee | H01L 27/3272 |
| 2018/0190747 A1* | 7/2018 | Son | G06F 3/1423 |
| 2018/0197885 A1* | 7/2018 | Lee | H01L 27/124 |
| 2019/0027096 A1* | 1/2019 | Kim | G09G 3/3266 |
| 2019/0213952 A1* | 7/2019 | Park | G09G 3/3233 |
| 2019/0304392 A1* | 10/2019 | Yeh | G09G 3/3266 |
| 2019/0371231 A1* | 12/2019 | Kim | G09G 3/2081 |
| 2020/0027388 A1* | 1/2020 | Iwaki | H01L 27/1052 |

FOREIGN PATENT DOCUMENTS

| | | |
|---|---|---|
| CN | 101910932 A | 12/2010 |
| CN | 103376580 A | 10/2013 |
| CN | 104103669 A | 10/2014 |
| CN | 106449706 A | 2/2017 |
| CN | 107132708 A | 9/2017 |
| CN | 107248521 A | 10/2017 |
| CN | 107579075 A | 1/2018 |
| CN | 107623023 A | 1/2018 |
| CN | 108122928 A | 6/2018 |
| CN | 108206198 A | 6/2018 |

* cited by examiner

DISPLAY PANEL AND DISPLAY DEVICE

CROSS REFERENCE TO RELATED APPLICATION

This application claims priority to Korean Patent Application No. 10-2018-0165270, filed in the Republic of Korea on Dec. 19, 2018, which is hereby incorporated by reference for all purposes as if fully set forth herein.

BACKGROUND

Field

Example embodiments relate to a display panel and a display device.

Description of Related Art

A display device of the related art may include a display panel, in which a plurality of data lines and a plurality of gate lines are disposed, and a driver circuit driving the display panel. The driver circuit may include a data driver driving a plurality of data lines and a gate driver driving a plurality of gate lines.

A display panel of the related art includes an active area in which an image is displayed and a bezel area at the periphery of the active area. The data driver is mounted on or electrically connected to the bezel area of the display panel. In addition, the gate driver may be electrically connected to or disposed within the bezel area of the display panel.

Therefore, in order to connect the active area and the driving circuit, the display device of the related art should have a large bezel area or requires a bezel area to some extent; however, the bezel area may be reduced. The presence and size of a bezel in such a display panel has become a great restriction on a design of the display device.

BRIEF SUMMARY

Various aspects of the present disclosure provide a display panel having a bezel-free structure, and a display device.

Also provided are a display panel and a display device having a structure able to improve element characteristics of an oxide transistor when the oxide transistor, as well as a low temperature polysilicon transistor, are included therein.

Also provided are a display panel and a display device having a structure able to protect transistors vulnerable to hydrogen.

Also provided is a multi-display device including display panels respectively having a bezel-free structure.

According to an aspect, example embodiments can provide a display panel including: a first plate; a second plate disposed on the first plate; a first layer stack disposed between the first plate and the second plate, with a first transistor being disposed therein; and a second layer stack disposed on the second plate, with a second transistor being disposed therein. The first transistor is disposed in a location overlapping an active area corresponding to an image display area.

The second transistor can be a transistor provided in each of a plurality of subpixels disposed in the active area.

The first transistor can be disposed to overlap an area of at least one subpixel of the plurality of subpixels.

The first transistor can be provided in a gate driving circuit embedded in the display panel.

The first transistor can be disposed to overlap an area of at least one subpixel, among the plurality of subpixels, disposed in a peripheral portion.

A side routing line for electrically connecting a first metal member disposed in the first layer stack and a second metal member disposed in the second layer stack can be disposed along a side surface of the second plate.

The side routing line can contact an upper surface of the second metal member, a side surface of the second metal member and an upper surface of the first metal member.

The side routing line can be disposed on a stepped portion at a side of the first layer stack.

The first metal member can be a source electrode or a drain electrode of the first transistor or can correspond to a pattern electrically connected to the source electrode or the drain electrode of the first transistor.

The second metal member can be a gate line electrically connected to a gate electrode of the second transistor or corresponds to a pattern electrically connected to the gate electrode of the second transistor.

Each of the first plate and second plate can be a polyimide substrate.

The first plate can be a polyimide substrate, and the second plate can be an organic insulating film.

The first layer stack can include at least one inorganic insulating film.

A bottom shield metal can be disposed below the first transistor.

The bottom shield metal can be electrically floated.

The bottom shield metal can be electrically connected to one of a source electrode, a drain electrode, and a gate electrode of the first transistor.

The first transistor and the second transistor can be different types of transistors.

In an example, the first transistor can be a low temperature polysilicon transistor, and the second transistor can be an oxide transistor different from the low temperature polysilicon transistor.

In another example, the second transistor can be an oxide transistor, and the first transistor can be a transistor different from the oxide transistor.

In another example, the first transistor can be a low temperature polysilicon transistor, and the second transistor can be an oxide transistor. In this situation, the second plate may be a hydrogen blocking plate, a hydrogen collecting plate, or the like. For example, the second plate may be a polyimide substrate.

The first transistor and the second transistor can be the same type of transistors.

In an example, the first transistor and the second transistor can be polysilicon transistors. In this situation, the second plate can be an organic insulating film, a polyimide substrate, or the like.

In another example, the first transistor and the second transistor can be oxide transistors. In this situation, the second plate can be a polyimide substrate, an organic insulating film, or the like.

According to another aspect, example embodiments can provide a display device including: a display including one or more display panels; and a data driving circuit for driving data lines disposed in the one or more display panels.

Each of the one or more display panels can include a first plate, a second plate disposed on the first plate, a first layer stack disposed between the first plate and the second plate, with a first transistor being disposed therein, and a second layer stack disposed on the second plate, with a second transistor being disposed therein.

The second transistor can be a transistor provided in each of a plurality of subpixels disposed in an active area corresponding to an image display area.

The first transistor can be disposed in a location overlapping the active area corresponding to the image display area.

The first transistor can be disposed to overlap an area of at least one subpixel of the plurality of subpixels.

The first transistor can be provided in a gate driving circuit embedded in each of the plurality of display panels and can be disposed to overlap an area of at least one subpixel, among the plurality of sub-pixels, disposed in a peripheral portion.

The display can include two or more display panels.

The display can have a flat shape or a cylindrical shape.

The first plate and the second plate can be flexible plates, such that the display has the cylindrical shape.

According to embodiments, the display panel and the display device having a bezel-free structure are provided.

According to embodiments, the display panel and the display device have a structure able to improve element characteristics of an oxide transistor when the oxide transistor, as well as an LTSP transistor, are included.

According to embodiments, the display panel and the display device having a structure able to protect a transistor vulnerable to hydrogen are provided.

According to embodiments, the multi-display device including the display panels having a bezel-free structure is provided.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION OF THE EMBODIMENTS

Figure 1:
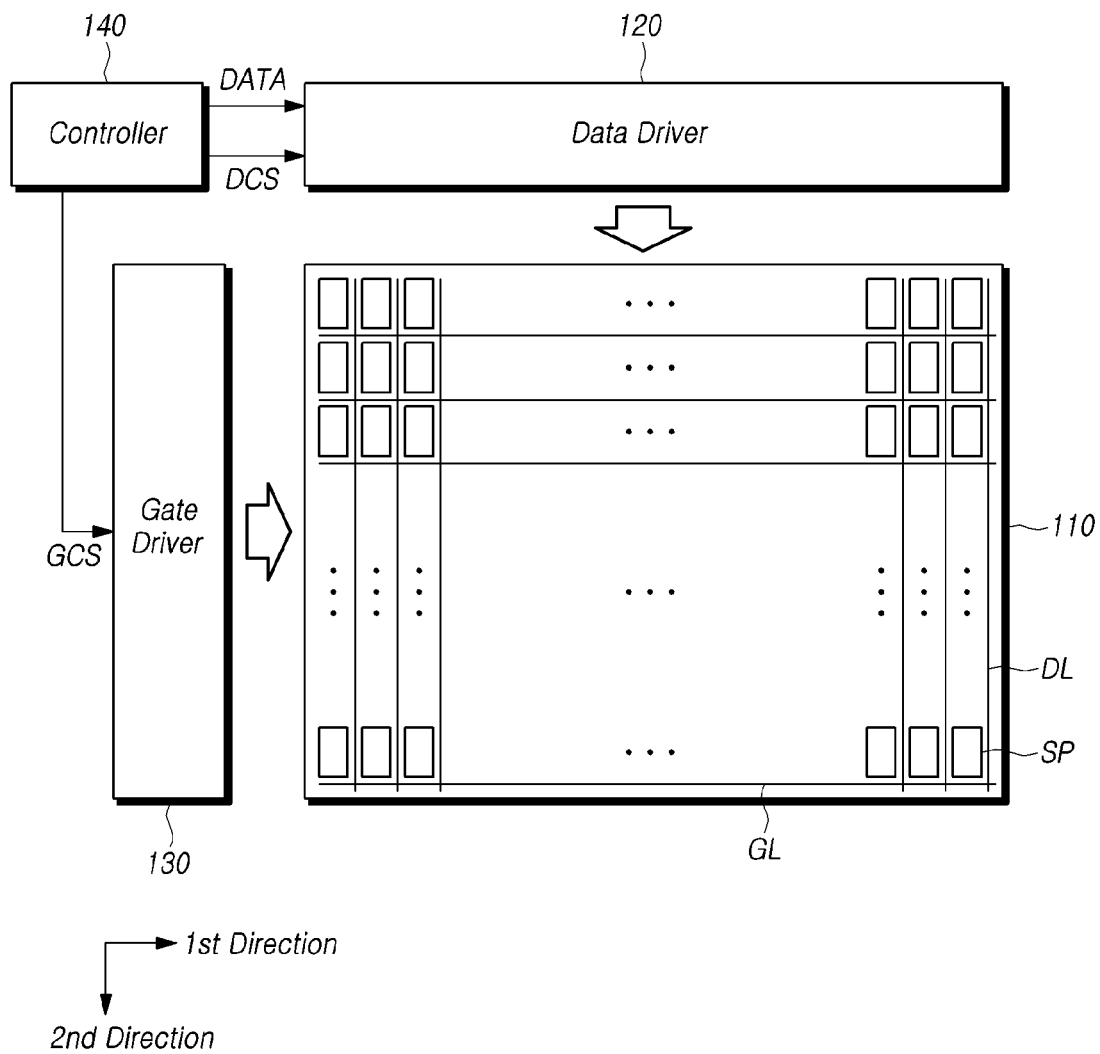
FIG. 1 illustrates a schematic configuration of a display device according to embodiments.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person having ordinary skill in the art. The scope of the present disclosure shall be defined by the appended Claims.

The shapes, sizes, ratios, angles, numbers, and the like, inscribed in the drawings to illustrate example embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation that the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element. In the same context, it will be understood that when an element is referred to as being formed "on" or "under" another element, not only can it be directly located on or under the other element, but it can also be indirectly located on or under the other element via an intervening element.

In addition, terms, such as "first" and "second" may be used herein to describe a variety of components. It should be understood, however, that these components are not limited by these terms. These terms are merely used to discriminate one element or component from other elements or components. Thus, a first element referred to as first hereinafter may be a second element within the spirit of the present disclosure.

The features of example embodiments may be partially or entirely coupled or combined with each other and may work in concert with each other or may operate in a variety of technical methods. In addition, respective embodiments may be carried out independently or may be associated with and carried out in concert with other embodiments.

Hereinafter, embodiments will be described in detail with reference to the accompanying drawings.

FIG. 1 illustrates a schematic configuration of a display device 100 according to embodiments.

The display device 100 according to embodiments can be an image display device, a lighting device, a light-emitting device, or the like.

The display device 100 according to embodiments can include a display panel 110 displaying an image or emitting light and a driver circuit driving the display panel 110.

In the display panel 110, a plurality of data lines DL and a plurality of gate lines GL can be disposed, and a plurality of subpixels SP, defined by the plurality of data lines DL and the plurality of gate lines GL, can be arrayed in the form of a matrix.

In the display panel 110, the plurality of gate lines GL are disposed in a first direction, while the plurality of data lines DL are disposed in a second direction different from the first direction. Accordingly, the plurality of data lines DL and the plurality of gate lines GL can be disposed to intersect each other. For example, the plurality of gate lines GL can be arrayed in rows or columns, while the plurality of data lines DL may be arrayed in columns or rows. In the following description, the plurality of gate lines GL will be regarded as being arrayed in rows, while the plurality of data lines DL will be regarded as being arrayed in columns, for the sake of brevity.

Various signal lines, other than the plurality of data lines DL and the plurality of gate lines GL, can be disposed in the display panel 110, depending on the subpixel structure or the like. Driving voltage lines, reference voltage lines, common voltage lines, and the like can further be disposed.

The display panel PNL can be one of various types of panels, such as a liquid crystal display (LCD) panel and an organic light-emitting diode (OLED) panel.

Types of signal lines disposed in the display panel PNL can vary, depending on the subpixel structure, the panel type (e.g. an LCD panel or an OLED panel), or the like. In addition, the term "signal lines" used herein can conceptually include electrodes to which signals are applied.

The driver circuits can include a data driver 120 driving the plurality of data lines DL, a gate driver 130 driving the plurality of gate lines GL, a controller 140 controlling the data driver 120 and the gate driver 130.

The data driver 120 can drive the plurality of data lines DL by outputting a data signal (or data voltage) to the plurality of data lines DL.

The gate driver 130 can drive the plurality of gate lines GL by outputting a scanning signal to the plurality of gate lines GL.

The controller 140 controls the data driver 120 and gate driver 130 by transferring a variety of control signals DCS and GCS for driving of the data driver 120 and the gate driver 130. In addition, the controller 140 can supply digital image data DATA to the data driver 120.

The controller 140 starts scanning at points in time realized by respective frames, converts image data input from an external source into image data DATA having a data signal format readable by the data driver 120, outputs the image data DATA, and controls data driving at appropriate points in time, according to the scanning.

The controller 140 receives timing signals, including a vertical synchronization signal Vsync, a horizontal synchronization signal Hsync, an input data enable signal DE, a clock signal CLK, and the like, from an external source (e.g., a host system), generates a variety of control signals, and outputs the variety of control signals to the data driver 120 and the gate driver 130 in order to control the data driver 120 and the gate driver 130.

For example, the controller 140 outputs a variety of gate control signals GCS, including a gate start pulse (GSP), a gate shift clock (GSC), a gate output enable (GOE) signal, and the like, to control the gate driver 130.

In addition, the controller 140 outputs a variety of data control signals DCS, including a source start pulse (SSP), a source sampling clock (SSC), a source output enable (SOE) signal, and the like, to control the data driver 120.

The controller 140 can be a timing controller used in a typical display device, or can be a control device including a timing controller and performing other control functions.

The controller 140 can be provided as a component separate from the data driver 120, or can be provided as an integrated circuit (IC) combined (or integrated) with the data driver 120.

The data driver 120 receives image data DATA from the controller 140 and supplies a data voltage to the plurality of data lines DL to drive the plurality of data lines DL. The data driver 120 is also referred to as a source driver.

The data driver 120 can send and receive a variety of signals or data to and from the controller 140 via a variety of interfaces.

When a specific gate line is opened by the gate driver 130, the data driver 120 converts the image data DATA, received from the controller 140, into an analog data signal, and supplies the data signal to the plurality of data lines DL.

The data driver 120 can be connected to one portion of the panel 110 (e.g., an upper, lower, right, or left portion of the panel 110). In some situations, the gate driver 130 can be disposed on both portions of the panel 110 (e.g. upper and lower portions or right and left portions of the panel 110), depending on the driving system, the design of the panel, or the like.

The data driver 120 can include one or more source driver ICs (SDICs).

Each of the source driver ICs can include a shift register, a latch circuit, a digital-to-analog converter (DAC), an output buffer, and the like. In some situations, the data driver 120 can further include one or more analog-to-digital converters (ADCs).

Each of the source driver ICs can be connected to a bonding pad of the display panel 110 by a tape-automated bonding (TAB) method or a chip-on-glass (COG) method, or can be directly mounted on the display panel 110. In some situations, each of the source driver ICs can be integrated with the display panel 110. In addition, each of the source driver ICs can be implemented using a chip-on-film (COF) structure. In this situation, each of the source driver ICs can be mounted on a circuit film to be electrically connected to the data lines DL in the display panel 110 via the circuit film.

The gate driver 130 sequentially drives the plurality of gate lines GL by sequentially supplying a scanning signal to the plurality of gate lines GL. The gate driver 130 is also referred to as a scan driver.

The gate driver 130 sequentially supplies the scanning signal having an on or off voltage to the plurality of gate lines GL, under the control of the controller 140.

Figure 3:
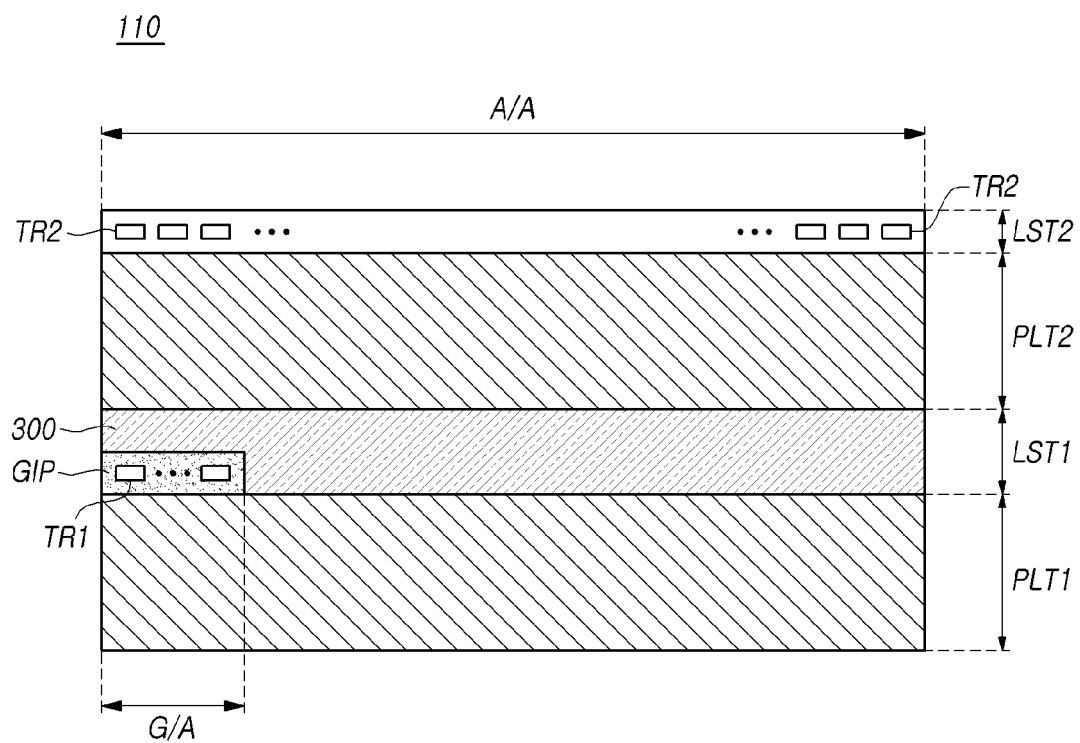
Figure 4:
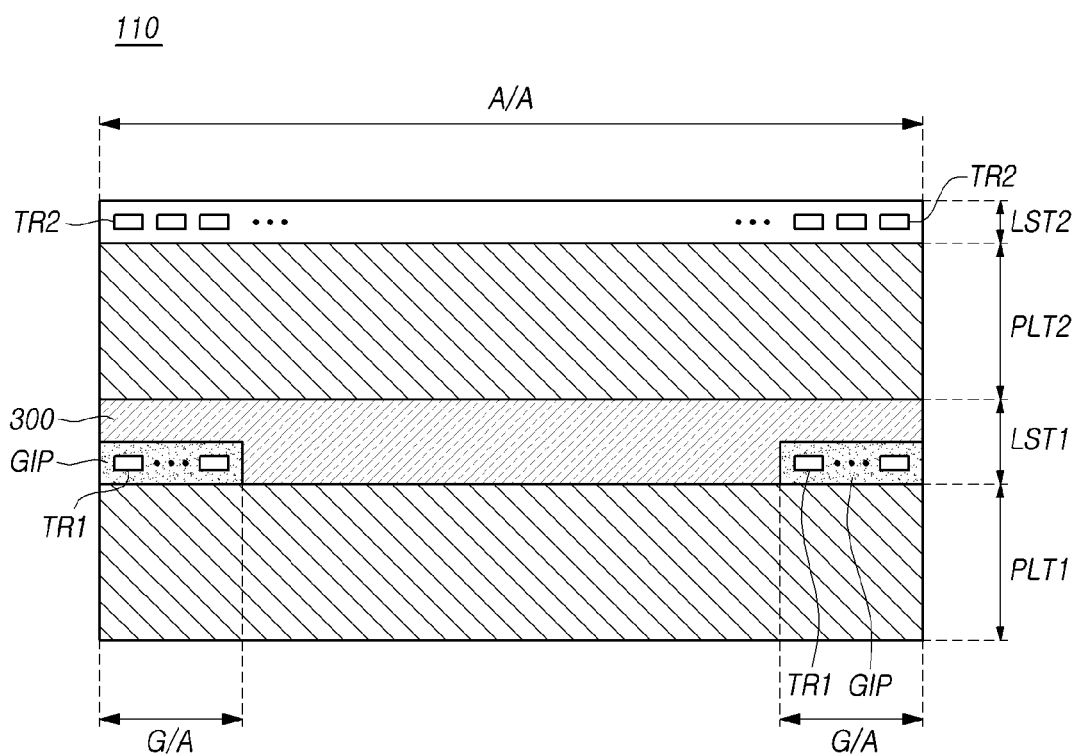

The gate driver 130 can be connected to one portion of the panel 110 (e.g., an upper, lower, right, or left portion of the panel 110), as illustrated in FIG. 3. In some situations, the data driver 120 can be disposed on both portions of the panel 110 (e.g., upper and lower portions or right and left portions of the panel 110), as illustrated in FIG. 4, depending on the driving system, the design of the panel, or the like.

The gate driver 130 can include a plurality of gate driver circuits (GDCs). The plurality of gate driver circuits can correspond to the plurality of gate lines GL, respectively.

Each of the gate driver circuits can include a shift register, a level shifter, and the like.

The plurality of gate driver circuits can be directly fabricated in the display panel 110. That is, the plurality of gate driver circuits can be disposed within the display panel 110. In other words, the gate driver circuits can be referred to as gate driver circuits embedded in the panel.

Figure 2:
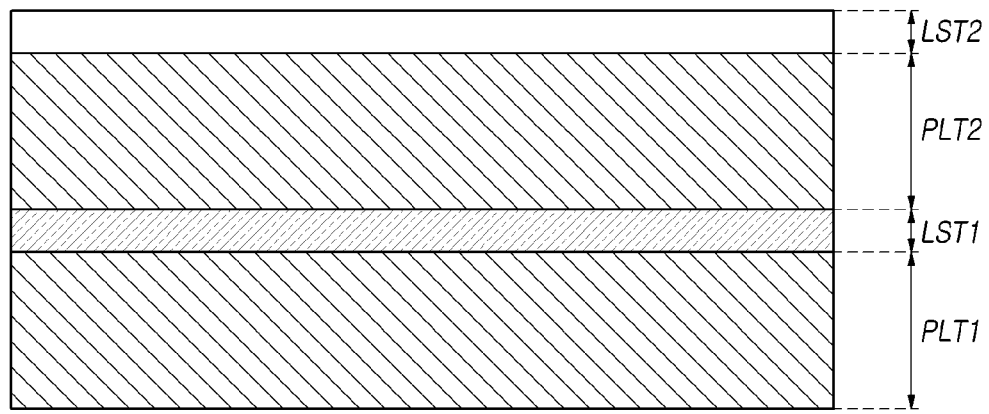
FIGS. 2 to 4 illustrate schematic cross-sectional structures of the display panel according to embodiments.
Figure 5:
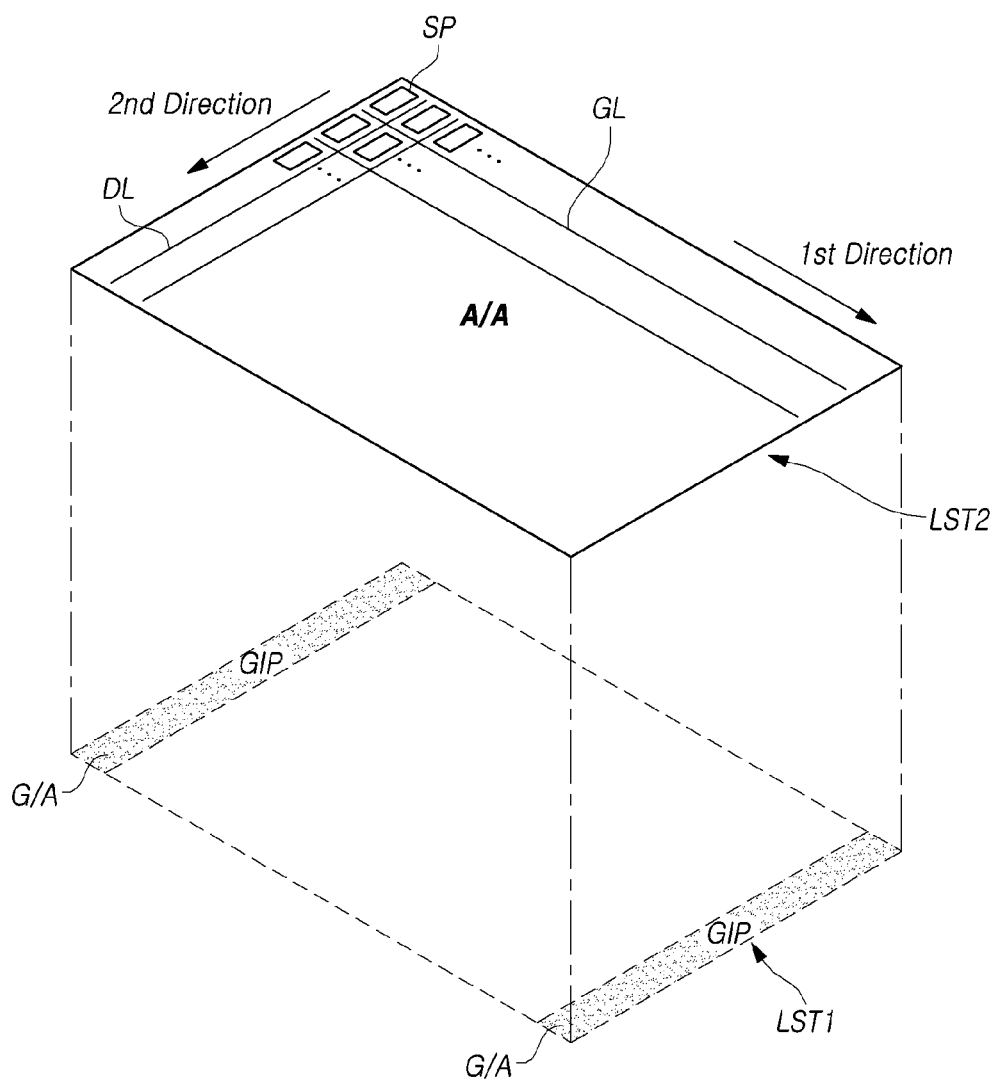
FIG. 5 illustrates an active area and a gate driving circuit area of the display panel according to embodiments.
Figure 6:
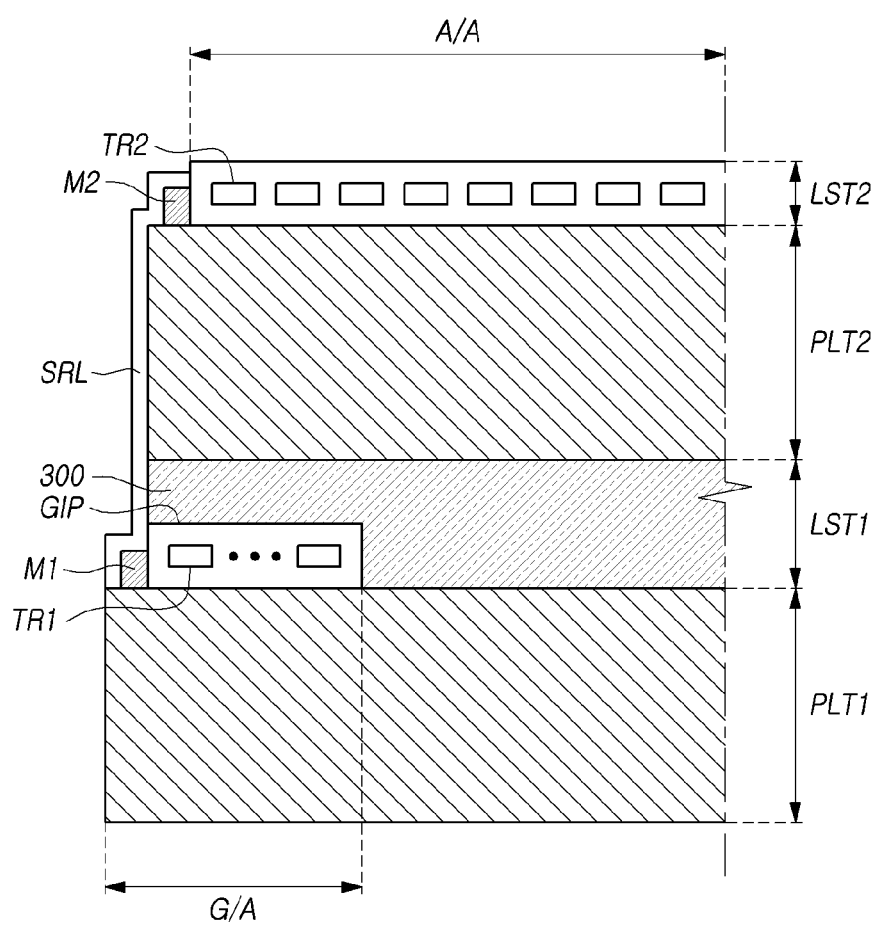
FIG. 6 illustrates a side connection structure according to embodiments, for electrically connecting a first metal member in a first layer stack and a second metal member in a second layer stack.

FIGS. 2 to 4 illustrate schematic cross-sectional structures of the display panel 110 according to embodiments. FIG. 5 illustrates an active area A/A and a gate driving circuit area G/A of the display panel 10 according to embodiments. FIG. 6 illustrates a side connection structure for electrically connecting a first metal member M1 in a first layer stack LST1 and a second metal member M2 in a second layer stack LST2 according to embodiments.

Referring to FIGS. 2 to 4, the display panel 110 according to embodiments can include a first plate PLT1, the first layer stack LST1, a second plate PLT2, the second layer stack LST2, and the like.

The second plate PLT2 is disposed on the first plate PLT1.

The first layer stack LST1 can be disposed between the first plate PLT1 and the second plate PLT2 and can include a plurality of layers. A metal material or an insulating material can be formed in each of the plurality of layers.

The second layer stack LST2 can be disposed on the second plate PLT2 and can include a plurality of layers. A metal material or an insulating material can be formed in each of the plurality of layers.

The first layer stack LST1 and the second layer stack LST2 are separated by the second plate PLT2.

A plurality of first transistors TR1 are disposed in the first layer stack LST1.

A plurality of second transistors TR2 are disposed in the second layer stack LST2.

The plurality of first transistors TR1 disposed in the first layer stack LST1 and the plurality of second transistors TR2 disposed in the second layer stack LST2 are separated by the second plate PLT2.

The plurality of first transistors TR1 can be disposed in the entire area of the first layer stack LST1 disposed between the first plate PLT1 and the second plate PLT2 or can be disposed in a certain area (for example, a peripheral area) of the first layer stack LST1.

The plurality of second transistors TR2 can be disposed in the entire area or a certain area of the second layer stack LST2 disposed on the second plate PLT2.

Referring to FIGS. 3 to 5, the plurality of second transistors TR2 constituting a plurality of subpixels SP arranged in the active area A/A corresponding to an image display area can be disposed in the second layer stack LST2.

Referring to FIGS. 3 to 5, the first layer stack LST1 can include the gate driving circuit area G/A.

A plurality of gate driving circuits GIP can be formed in the gate driving circuit area G/A in the first layer stack LST1 of the display panel 110.

The plurality of first transistors TR1 disposed in the first layer stack LST1 can be transistors constituting the plurality of gate driving circuits GIP.

The first transistor TR1 can be disposed to overlap an area of at least one subpixel SP of the plurality of subpixels SP. For example, the first transistor can be disposed to overlap an area of at least one subpixel SP, among the plurality of subpixels SP, disposed in a peripheral portion.

As shown in FIG. 3, a position of the first layer stack LST1, in which the plurality of gate driving circuits GIP are formed, can be one side of the first layer stack LST1.

That is, the plurality of first transistors TR1 constituting the plurality of gate driving circuits GIP can be disposed in a peripheral area of one side in the first layer stack LST1.

In other words, the plurality of first transistors TR1 constituting the plurality of gate driving circuits GIP can overlap the active area A/A, e.g., one side area of the active area A/A. In other words, a gate driving circuit can be disposed directly under or directly overlapping with the sub-pixel or sub-pixels which it controls, all within the same panel, thus providing a very compact structure.

As shown in FIG. 4, positions of the first layer stack LST1, at which the plurality of gate driving circuits GIP are formed, can be one side and the other side of the first layer stack LST1 (e.g., GIP formed on both sides).

That is, the plurality of first transistors TR1 constituting the plurality of gate driving circuits GIP can be disposed in a peripheral area of one side and a peripheral area of the other side in the first layer stack LST1.

In other words, the plurality of first transistors TR1 constituting the plurality of gate driving circuits GIP can overlap the active area A/A, e.g., both side areas of the active area A/A.

As described above, since the gate driving circuit area G/A is not present separately from the active area A/A, but is present to vertically overlap a portion of the active area A/A, a bezel area may not be present in the display panel 10, or even if the bezel area is present, the bezel area can be very small. Thus, the display panel 110 according to embodiments has a bezel-free structure.

Referring to FIGS. 3 and 4, the first layer stack LST1 can further include at least one inorganic insulating film 300.

The at least one inorganic insulating film 300 can serve as an insulating film for forming the plurality of first transistors TR1 constituting the gate driving circuit GIP can serve to separate the gate driving circuit GIP and the second plate PLT2 and can serve as a buffer to reduce an influence of the first plate PLT1 on the second layer stack LST2.

In addition to the plurality of second transistors TR2 constituting the plurality of subpixels SP, a plurality of capacitors and a plurality of light emitting elements corresponding to components of the plurality of subpixels SP, and various signal lines for driving the plurality of subpixels SP can be formed in the second layer stack LST2.

Referring to FIGS. 3 to 5, a bezel area disposed outside the active area A/A can be very small or may not be present on both sides of a gate line GL of various signal lines for driving the plurality of subpixels SP.

In the past, since the gate drive circuit GIP was formed in a bezel area corresponding to an outer area of the active area A/A, e.g., the bezel area, in which the gate driving circuit GIP was formed, did not overlap the active area A/A, the bezel area was necessarily present, and the bezel area also had to be quite large. Here, bezel size acts to limit the design freedom of the display device 100.

However, according to the cross-sectional structure of FIGS. 3 to 5, since the gate driving circuit area G/A vertically overlaps the active area A/A, a bezel area disposed outside the active area A/A in a first direction does not need to be present to be used for the gate driving circuit area.

Referring to FIG. 6, the display panel 110 can include a side routing line SRL which electrically connects the first metal member M1 disposed in the first layer stack LST1 and the second metal member M2 disposed in the second layer stack LST2. Here, the first layer stack LST1 and the second layer stack LST2 are separated by the second plate PLT2. Here, as shown in FIG. 6, a stepped portion may be formed at a side of the first layer stack LST1 due to the first metal member M1, and the side routing line SRL is disposed on the stepped portion of the first layer stack LST1.

The side routing lines SRL can be disposed along a side surface of the second plate PLT2.

Referring to FIG. 6, the first metal member M1 electrically connected to one end of the side routing line SRL can be a source electrode or a drain electrode of the first transistor TR1 disposed in the first layer stack LST1 or can correspond to a pattern electrically connected to the source electrode or the drain electrode of the first transistor TR1.

Referring to FIG. 6, the second metal member M2 electrically connected to the other end of the side routing line SRL can be a gate line electrically connected to a gate electrode of the second transistor TR2 disposed in the second layer stack LST2 or can be correspond to a pattern electrically connected to the gate line.

Each of the first plate PLT1 and the second plate PLT2 can be a flexible plate.

The first plate PLT1 can serve as a substrate on which the first layer stack LST1 is formed, and can be, for example, a polyimide (PI) substrate.

The second plate PLT2 can serve as a substrate on which the second layer stack LST2 is formed, and can be, for example, a polyimide substrate or an organic insulating layer.

The second plate PLT2 can serve as the substrate, and can also serve to block hydrogen migrating from the first layer stack LST1.

On the other hand, the first transistor TR1 disposed in the first layer stack LST1 can be provided as various types of transistors, in terms of physical properties and structural aspects. The second transistor TR1 disposed in the second layer stack LST2 can be provided as various types of transistors in terms of physical properties and a structural aspect.

For example, since the first transistor TR1 disposed in the first layer stack LST1 is a transistor constituting the gate driving circuit GIP, and thus requires high electron mobility and high speed driving, the first transistor TR1 can be provided as a low temperature polysilicon (LTPS) transistor.

An LTPS process is a process that requires hydrogen. Therefore, hydrogen can be present in the first layer stack LST1.

On the other hand, since the second transistor TR2 disposed in the second layer stack LST2 constitutes the subpixel SP for driving an image, uniformity of mobility and the like may be very important. Therefore, the second transistor TR2 can be provided as an oxide transistor having excellent uniformity.

In this regard, the second transistor TR2 disposed in the second layer stack LST2 can include an oxide transistor (e.g., the channel or active layer of the transistor can be formed of an oxide). However, in this situation, when an oxide semiconductor disposed in the second layer stack LST2 is exposed to hydrogen, performance of the oxide semiconductor may be deteriorated.

Therefore, although hydrogen is present in the first layer stack LST1 and the second transistor TR2 disposed in the second layer stack LST2 is vulnerable to hydrogen, when the second plate PLT2 disposed between the first layer stack LST1 and the second layer stack LST2 is provided as a layer able to block hydrogen, the second transistor TR2 can be prevented from being exposed to hydrogen due to a hydrogen-blocking function of the second plate PLT2. In other words, the channel of the oxide transistor in the second layer stack can be vulnerable to damage from hydrogen used for making the LTPS transistor in the first layer stack, thus the second plate can protect the channel of the first transistor from being exposed to hydrogen.

On the other hand, the second transistor TR2 disposed in the second layer stack LST2 can include different types of transistors (for example, an oxide transistor, an LTPS transistor, and the like). In addition, the first transistor TR1 disposed in the first layer stack LST1 can include different types of transistors (for example, an oxide transistor, an LTPS transistor, and the like).

A thickness of the first plate PLT1 and a thickness of the second plate PLT2 can be the same.

Alternatively, the thickness of the first plate PLT1 and the thickness of the second plate PLT2 can be different from each other. For example, the thickness of the first plate PLT1 can be greater than the thickness of the second plate PLT2.

Figure 7:
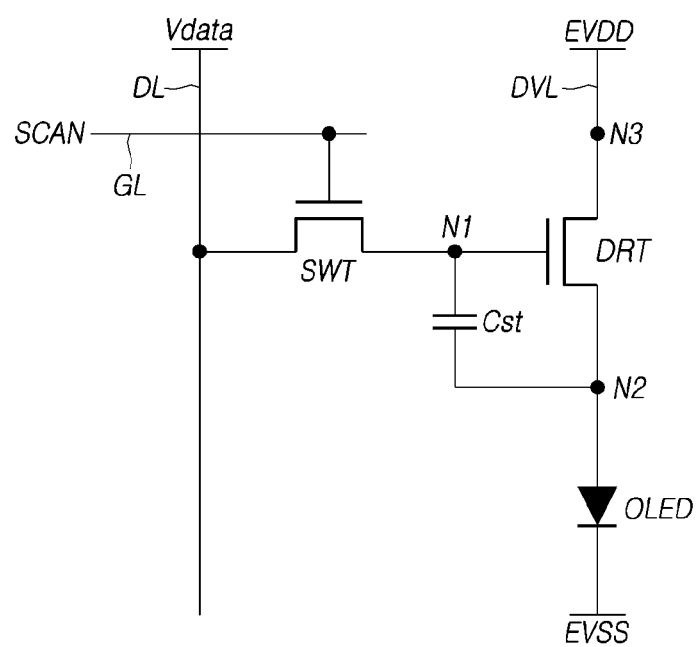
FIG. 7 illustrates a subpixel circuit of the display panel according to embodiments.

FIG. 7 illustrates a subpixel circuit of the display panel 110 according to embodiments.

Referring to FIG. 7, when the display panel 110 is an OLED panel, each of the plurality of subpixels SP can include an organic light-emitting diode OLED, a driving transistor DRT, a switching transistor SWT, and a storage capacitor Cst, and the like.

The organic light-emitting diode OLED can include an anode, an organic light-emitting layer, a cathode, and the like.

According to the illustration of FIG. 7, the anode of the organic light-emitting diode OLED corresponds to a pixel electrode, and a base voltage EVSS corresponding to a common voltage can be applied to the cathode (also referred to as a common electrode) of the organic light-emitting diode OLED.

Here, the base voltage EVSS can be, for example, a ground voltage or a voltage higher or lower than the ground voltage. In addition, the base voltage EVSS can vary according to a driving state. For example, the base voltage EVSS during image driving and the base voltage EVSS during sensing driving can be set to be different from each other.

The driving transistor DRT supplies a driving current to the organic light-emitting diode OLED to drive the organic light-emitting diode OLED.

A gate node of the driving transistor DRT is electrically connected to a first node N1.

A source node (or a drain node) of the driving transistor DRT can be electrically connected to a second node N2. Here, the anode of the organic light-emitting diode OLED can be connected to the second node N2.

The drain node (or the source node) of the driving transistor DRT can be electrically connected to a third node N3. Here, the third node N3 can be a node to which a driving voltage line DVL is electrically connected, and a driving voltage EVDD can be applied to the third node N3.

The switching transistor SWT can be connected between the first node N1 and a corresponding data line DL.

A gate node of the switching transistor SWT can be electrically connected to the gate line GL that supplies a scan signal SCAN. A drain node (or a source node) of the switching transistor SWT can be electrically connected to the data line DL. A drain node (or a source node) of the switching transistor SWT can be electrically connected to the data line DL.

The switching transistor SWT can be on-off controlled by the scan signal SCAN applied to the gate node through the gate line GL.

When the switching transistor SWT is turned on by the scan signal SCAN, the switching transistor SWT can transmit a data voltage Vdata supplied from the corresponding data line DL to the gate node of the driving transistor DRT.

The storage capacitor Cst can serve to maintain a certain voltage for a certain amount of time (for example, a single frame time).

The storage capacitor Cst can be electrically connected between the first node N1 and the second node N2 or can be electrically connected between the first node N1 and the third node N3.

The storage capacitor Cst can be an external capacitor intentionally designed to be disposed externally of the driving transistor DRT, rather than a parasitic capacitor (e.g., Cgs or Cgd), e.g., an internal capacitor present between the source/drain/gate nodes of the driving transistor DRT.

Each of the driving transistor DRT and the switching transistor SWT can be an n-type transistor or a p-type transistor.

The subpixel structure (2T1C structure) illustrated in FIG. 7 is provided for illustrative purposes only, and in some situations, one or more transistors or one or more capacitors can further be included. Alternatively, each of the plurality of subpixels SP can have the same structure, or some of the plurality of subpixels SP can have different structures.

Figure 8:
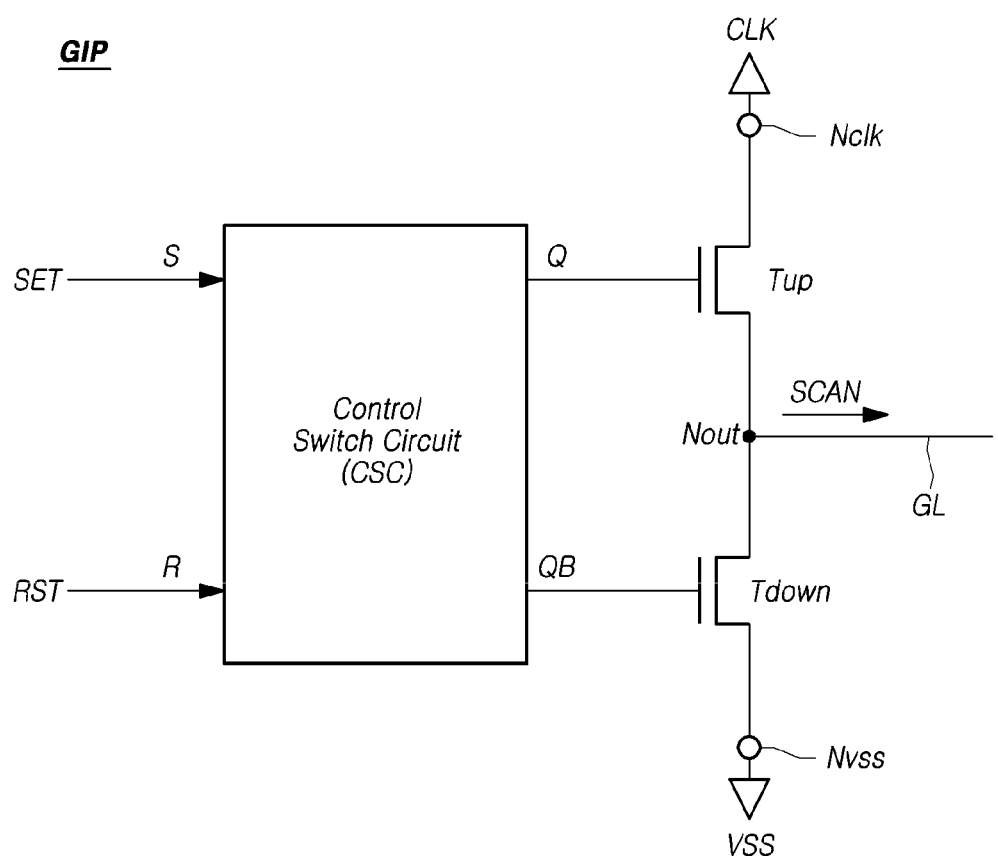
FIG. 8 illustrates a gate driving circuit according to embodiments.

FIG. 8 illustrates the gate driving circuit GIP according to embodiments.

Referring to FIG. 8, the gate driving circuit GIP can include a pull-up transistor Tup, a pull-down transistor Tdown, a control switch circuit CSC, and the like.

The control switch circuit CSC can be a circuit which controls a voltage of a node Q corresponding to a gate node of the pull-up transistor Tup and a voltage of a node QB corresponding to a gate node of the pull-down transistor Tdown) and can include a plurality of switches (transistors).

The pull-up transistor Tup is a transistor which supplies a scan signal SCAN, corresponding to a turn-on level voltage (for example, a high level voltage VGH), to the gate line GL via an output node Nout.

The pull-down transistor Tdown is a transistor which supplies a scan signal SCAN, corresponding to a turn-off level voltage (for example, a low level voltage VGL), to the gate line GL via the output node Nout.

The pull-up transistor Tup and the pull-down transistor Tdown can be turned on at different points in time.

The pull-up transistor Tup is electrically connected between a clock signal applying node Nclk to which a clock signal CLK is applied and the output node Nout electrically connected to the gate line GL and is turned on and off by a voltage of the node Q.

The gate node of the pull-up transistor Tup is electrically connected to the node Q. A drain node or a source node of the pull-up transistor Tup is electrically connected to the clock signal supplying node Nclk. The source node or the drain node of the pull-up transistor Tup is electrically connected to the output node Nout to which the scan signal is output.

The pull-up transistor Tup is turned on by the voltage of the node Q and supplies the scan signal SCAN having the high level voltage VGH in a high level section of the clock signal CLK to the output node Nout.

The scan signal SCAN having the high level voltage VGH, output to the output node Nout, is supplied to a corresponding gate line GL.

The pull-down transistor Tdown is electrically connected between the output node Nout and a base voltage node Nvss and is turned on or off by the voltage of the node QB.

The gate node of the pull-down transistor Tdown is electrically connected to the node QB. A drain node or a source node of the pull-down transistor Tdown is electrically connected to the base voltage node Nvss to receive a base voltage VSS corresponding to a constant voltage. The source node or the drain node of the pull-down transistor Tdown is electrically connected to the output node Nout to which the scan signal SCAN is output.

The pull-down transistor Tdown is turned on by the voltage of the node QB and outputs the scan signal SCAN having the low level voltage VGL to the output node Nout.

The scan signal SCAN having the low level voltage VGL can be supplied to a corresponding gate line GL via the output node Nout. Here, the scan signal SCAN having the low level voltage VGL can be, for example, the base voltage VSS.

On the other hand, the control switch circuit CSC can include at least two transistors and can include main nodes such as the node Q, the node QB, a set node S (also referred to as a start node), and a reset node R. In some situations, the control switch circuit CSC can further include an input node and the like to which various voltages such as a driving voltage VDD are input.

In the control switch circuit CSC, the node Q is electrically connected to the gate node of the pull-up transistor Tup, and charging and discharging are repeated.

In the control switch circuit CSC, the node QB is electrically connected to the gate node of the pull-down transistor Tdown, and charging and discharging are repeated.

In the control switch circuit CSC, a set signal SET for instructing the gate driving circuit GIP to start gate driving is applied to the set node S.

The set signal SET applied to the set node S can be a start signal VST input from the outside of the gate driver 130 or can be a feedback signal (carry signal) of a scan signal SCAN output from a gate driving circuit GIP of a previous stage, which precedes a current gate driving circuit GIP.

In the control switch circuit CSC, a reset signal RST applied to the reset node R can be a reset signal for simultaneously initializing the gate drive circuits GIP of the entire stages and can be a reset signal input from another stage (previous or subsequent stage).

The control switch circuit CSC charges the node Q in response to the set signal SET and discharges the node Q in response to the reset signal RST. The control switch circuit CSC can include an inverter circuit to charge or discharge the node Q and the node QB at different points in time.

Figure 9:
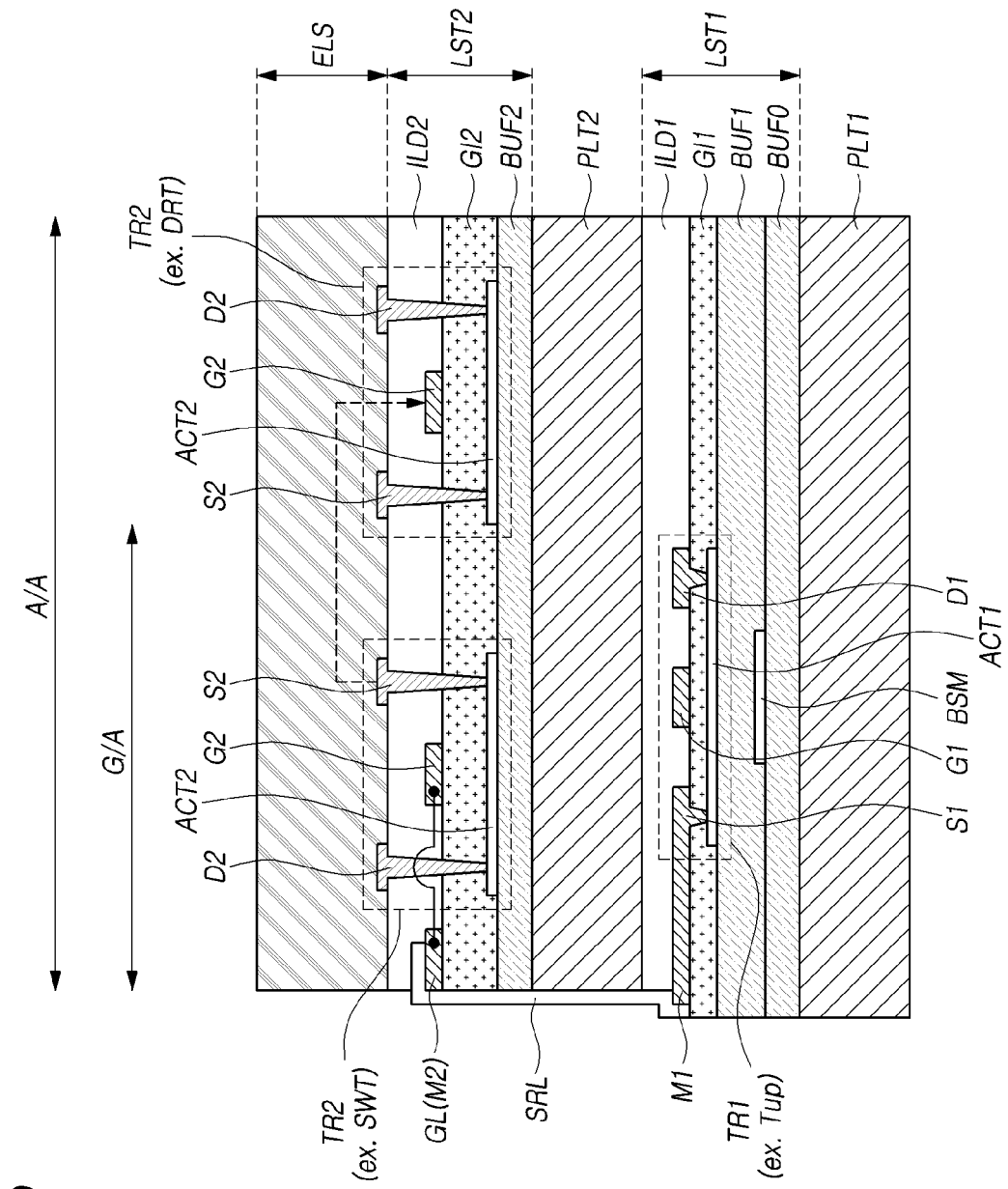
FIG. 9 illustrates a cross-sectional structure of the display panel according to embodiments.

FIG. 9 illustrates a cross-sectional structure of the display panel 110 according to embodiments.

In the illustration of FIGS. 9 to 12, the first transistors TR1 disposed in the first layer stack LST1 are the pull-up transistors Tup of FIG. 8, and the second transistors TR2 disposed in the second layer stack LST2 is the driving transistor DRT and the switching transistor SWT of FIG. 7.

Referring to FIG. 9, according to the cross-sectional structure of the display panel 110 according to embodiments, the first layer stack LST1 can be disposed on the first plate PLT1, the second plate PLT2 can be disposed on the first layer stack LST1, and the second layer stack LST2 can be disposed on the second plate PLT2.

The first layer stack LST1 can include the gate driving circuit area G/A vertically overlapping the active area A/A. The gate driving circuit GIP, including the first transistor TR1, can be formed in the gate driving circuit area G/A. In other words, a gate driving circuit can be disposed directly under the sub-pixel which it controls, all within the same panel.

The first transistor TR1 can include a first active layer ACT1, a first gate electrode G1, a first source electrode S1, and a first drain electrode D1.

Hereinafter, the structure of the first transistor TR1 will be described in more detail.

A lower buffer layer BUF0 can be disposed on the first plate PLT1.

A bottom shield metal BSM can be disposed on the lower buffer layer BUF0.

A first buffer layer BUF1 can be disposed on the lower buffer layer BUF0 to cover the bottom shield metal BSM on the lower buffer layer BUF0.

The first active layer ACT1 is disposed on the first buffer layer BUF1.

A first gate insulating film GI1 is disposed on the first active layer ACT1.

The first gate electrode G1 can be disposed on the first gate insulating film GI1. The first gate electrode G1 can overlap a portion of the first active layer ACT1.

A first source electrode S1 and a first drain electrode D1 can be disposed on the first gate insulating film GI1. In some situations, the first source electrode S1 and the first drain electrode D1 can be disposed on another insulating film (for example, an interlayer insulating film) on the first gate insulating film GI1.

The first source electrode S1 can be in direct contact with a portion of the first active layer ACT1 through a hole of the first gate insulating film GI1 or can be in contact with a portion of the first active layer ACT1 via a connection pattern.

The first drain electrode D1 can be in direct contact with the other portion of the first active layer ACT1 through the other hole of the first gate insulating film GI1 or can be in contact with the other portion of the first active layer ACT1 via the connection pattern.

An area of the first active layer ACT1 which overlaps the first gate electrode G1, is an area in which a channel is formed, and the remaining area thereof can be an area processed to be conductive.

A first interlayer insulating film ILD1 can be disposed on the first gate insulating film GI1 to cover the first gate electrode G1, the first source electrode S1, and the first drain electrode D1 disposed on the first gate insulating film GI1.

Here, the first interlayer insulating film ILD1, the first gate insulating film GI1, the first buffer layer BUF1, and the lower buffer layer BUF0 can correspond to the inorganic insulating film 300 as shown in FIGS. 3 and 4.

The second plate PLT2 can be disposed on the first interlayer insulating film ILD1.

The second layer stack LST2 can be disposed on the second plate PLT2, and the second transistor TR2 can be formed in the second layer stack LST2.

The second transistor TR2 can include a second active layer ACT2, a second gate electrode G2, a second source electrode S2, and a second drain electrode D2.

A structure of the second transistor TR2 will be described in more detail below.

The second active layer ACT2 is disposed on a second buffer layer BUF2.

A second gate insulating film GI2 is disposed on the second active layer ACT2.

The second gate electrode G2 can be disposed on the second gate insulating film GI2. The second gate electrode G2 can overlap a portion of the second active layer ACT2.

A second interlayer insulating film ILD2 can be disposed on the second gate insulating film GI2 to cover the second gate electrode G2 on the second gate insulating film GI2.

The second source electrode S2 and the second drain electrode D2 can be disposed on the second interlayer insulating film ILD2.

The second source electrode S2 can be in direct contact with a portion of the second active layer ACT2 through holes of the second interlayer insulating film ILD2 and the second gate insulating film GI2 or can be in contact with a portion of the second active layer ACT2 via a connection pattern.

The second drain electrode D2 can be in direct contact with the other portion of the second active layer ACT2 through other holes of the second interlayer insulating film ILD2 and the second gate insulating film GI2 or can be in contact with the other portion of the second active layer ACT2 via the connection pattern.

An area of the second active layer ACT2, which overlaps the second gate electrode G2, is an area in which a channel is formed, and the remaining area thereof can be an area processed to be conductive.

Here, the second interlayer insulating film ILD2, the second gate insulating film GI2, and the second buffer layer BUF2 can correspond to an inorganic insulating film.

A light-emitting element stack ELS, in which the organic light-emitting diode OLED is formed, can be disposed on the second interlayer insulating film ILD2. In the light-emitting element stack ELS, an anode and a light-emitting layer are provided in every subpixel area, and a cathode can be formed on the entire surface.

In addition, an encapsulating layer can be formed on the light-emitting element stack ELS.

The encapsulation layer can, for example, include at least one inorganic layer and at least one organic layer. For example, the encapsulation layer can include an inorganic layer, an organic layer, and an inorganic layer in this order.

In another example, the encapsulation layer can be a metal layer in the form of a thin film.

Further referring to FIG. 9, the subpixel structure of FIG. 7, and the gate driving circuit GIP of FIG. 8, the first source electrode S1 of the first transistor TR1, corresponding to the pull-up transistor Tup included in the gate driving circuit GIP, should be electrically connected to the gate line GL connected to the second gate electrode G2 of the second transistor TR2 corresponding to the switching transistor SWT included in the subpixel SP. Otherwise, when the transistor type is changed, the first drain electrode D1 of the first transistor TR1, corresponding to the pull-up transistor Tup included in the gate driving circuit GIP, can be electrically connected to the gate line GL connected to the second gate electrode G2 of the second transistor TR2 corresponding to the switching transistor SWT included in the subpixel SP.

As such a connection structure, the side routing line SRL can be disposed on a side surface of the second plate PLT2. The side routing line SRL can also be disposed on a side surface of an upper layer of the first layer stack LST1 and on a side surface of a lower layer of the second layer stack LST2.

The side routing line SRL electrically connects the first source electrode S1 of the first transistor TR1 corresponding to the first metal member M1 formed in the first layer stack LST1 and the gate line GL corresponding to the second metal member M2 formed in the layer stack LST2. Here, for example, the first metal member M1 in the first layer stack LST1 connected to the side routing line SRL can be a source electrode or a drain electrode of the pull-up transistor Tup in the gate driving circuit GIP or a source electrode or a drain electrode of the pull-down transistor Tdown.

Referring to the subpixel structure of FIG. 7 together with FIG. 9, in the second layer stack LST2, the second source electrode S2 or the second drain electrode D2 of the second transistor TR2, corresponding to the switching transistor SWT in the subpixel SP, can be electrically connected to the second gate electrode G2 of the second transistor TR2 corresponding to the driving transistor DRT in the subpixel SP.

Meanwhile, the bottom shield metal BSM disposed below the first transistor TR1 can be floated. In this situation, no power (voltage or current) is applied to the bottom shield metal BSM.

The bottom shield metal BSM can serve to block light coming from below.

The bottom shield metal BSM disposed below the first transistor TR1 can be electrically connected to the first source electrode S1 or the first drain electrode D1 of the first transistor TR1.

In this situation, the bottom shield metal BSM can serve to block light coming from below and can also serve as a body of the first transistor TR1 and thus can allow the first transistor TR1 to be stably and reliably operated, thereby improving performance of the first transistor TR1.

The bottom shield metal BSM disposed below the first transistor TR1 may not be connected to the first source electrode S1 or the first drain electrode D1 of the first transistor TR1 and can be electrically connected to the first gate electrode G1.

In this situation, the bottom shield metal BSM and the first gate electrode G1 can be operated as multi-gate electrodes of the first transistor TR1 to improve on-off characteristics of the first transistor TR1.

On the other hand, the first transistor TR1 disposed in the first layer stack LST1 and the second transistor TR2 disposed in the second layer stack LST2 can include different type of transistors. For example, the second transistor TR2 can include an oxide transistor, and the first transistor TR1 can include a transistor (e.g., an amorphous silicon transistor, an LTPS transistor, and the like) different from the oxide transistor. In another example, the first transistor TR1 include the LTPS transistor, and the second transistor second TR2 can include the oxide transistor.

On the other hand, when the first layer stack LST1 includes the LTPS transistor and the second layer stack LST2 includes the oxide transistor, the second plate PLT2 can be a polyimide (PI) substrate. Accordingly, the second plate PLT2 can prevent hydrogen or the like in the first layer stack LST1 from adversely affecting the oxide transistor included in the second layer stack LST2.

On the other hand, when the first layer stack LST1 does not include the LTPS transistor, or when the second layer stack LST2 does not include the oxide transistor, the second plate PLT2 can be a polyimide substrate or a substrate different from the polyimide substrate.

On the other hand, the first transistor TR1 disposed in the first layer stack LST1 and the second transistor TR2 disposed in the second layer stack LST2 can be the same transistor. For example, the first transistor TR1 and the second transistor TR2 can be an LTPS transistor or an oxide transistor.

Figure 10:
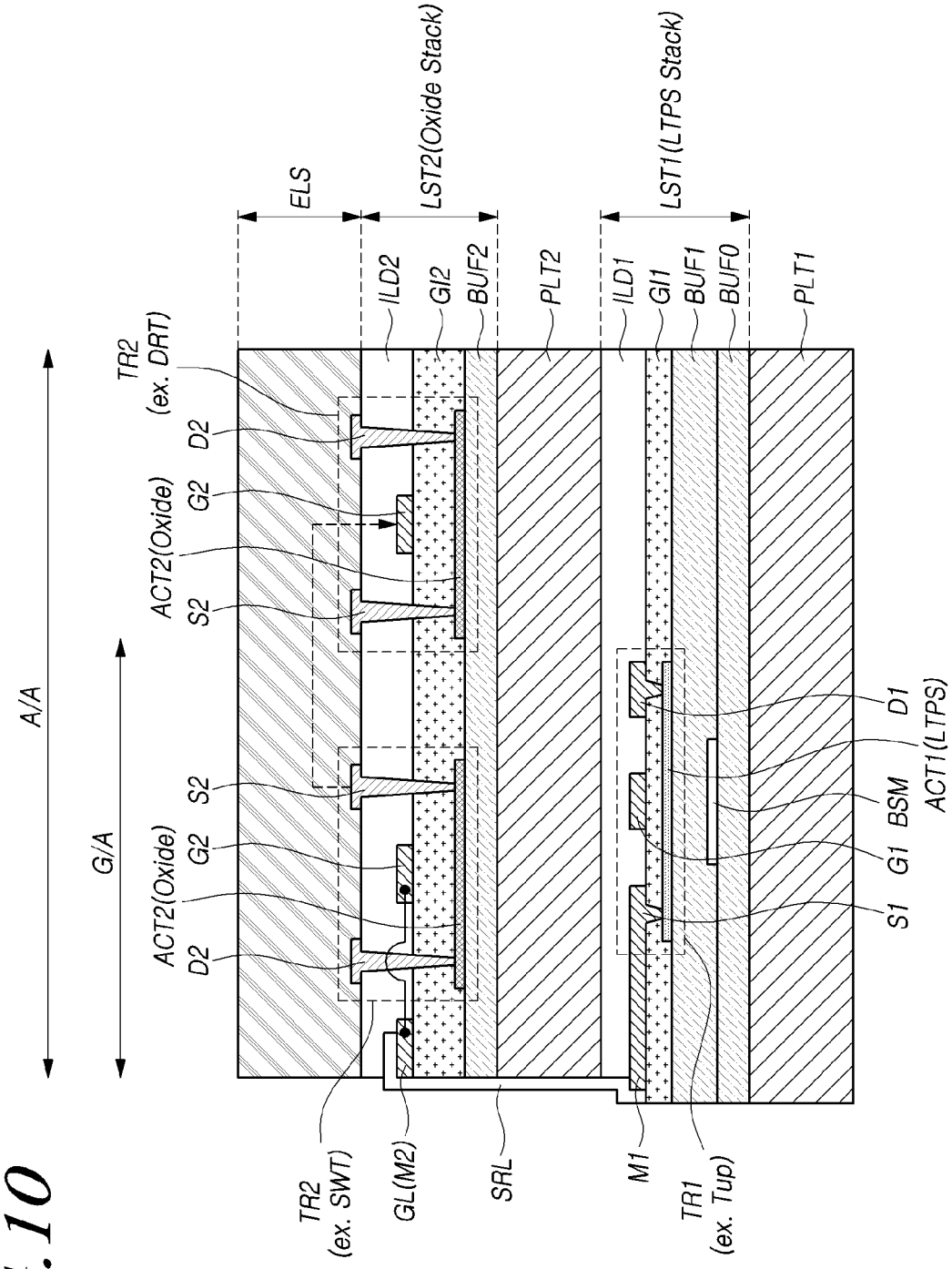
FIGS. 10 to 12 illustrate cross-sectional structures of a first transistor included in a first layer stack and a second transistor included in a second layer stack, according to the types thereof, according to embodiments.
Figure 11:
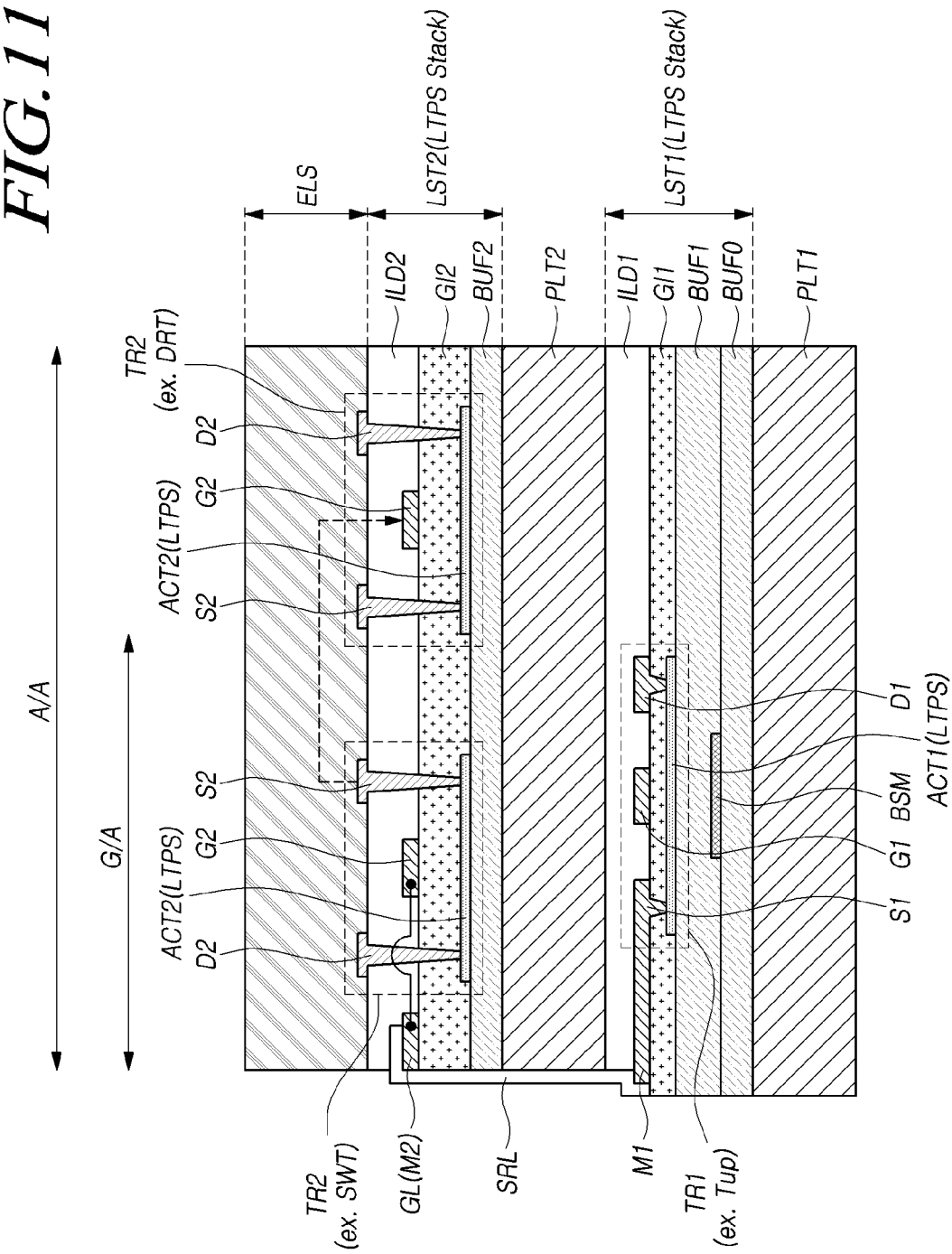
Figure 12:
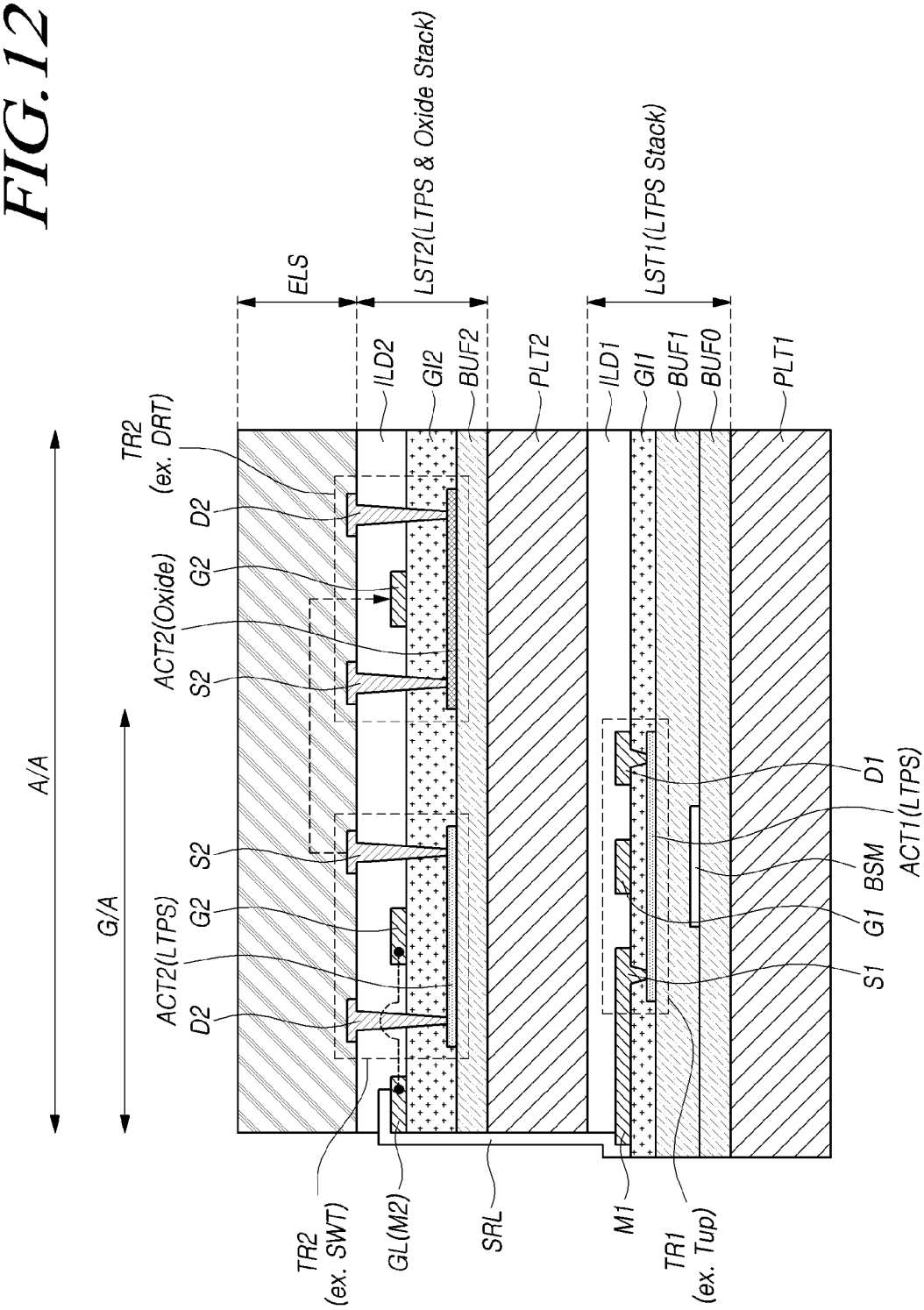

FIGS. 10 to 12 illustrate cross-sectional structures of the first transistor TR1 included in the first layer stack LST1 and the second transistor TR2 included in the second layer stack LST2 according to types thereof.

According to the illustration of FIG. 10, the first layer stack LST1 can be an LTPS stack including an LTPS semiconductor material, and the second layer stack LST2 can be an oxide stack including an oxide semiconductor material.

The first transistor TR1 disposed in the first layer stack LST1 can be an LTPS transistor in which the first active layer ACT1 is an LTPS semiconductor, and the second transistor TR2 disposed in the second layer stack LST2 can be an oxide transistor in which the second active layer ACT2 is an oxide semiconductor.

Here, the LTPS transistor has high mobility. The oxide transistor has high uniformity.

According to the illustration of FIG. 11, both of the first layer stack LST1 and the second layer stack LST2 can be an LTPS stack including an LTPS semiconductor material.

Referring to FIG. 11, the first transistor TR1 disposed in the first layer stack LST1 is an LTPS transistor in which the first active layer ACT1 is an LTPS semiconductor. The second transistor TR2 disposed in the second layer stack LST2 can also be an LTPS transistor in which the second active layer ACT2 is an LTPS semiconductor.

According to the illustration of FIG. 12, the first layer stack LST1 can be an LTPS stack including an LTPS semiconductor material, and the second layer stack LST2 can be an LTPS and oxide stack including an oxide semiconductor material and an LTPS semiconductor material.

Referring to FIG. 12, the first transistor TR1 disposed in the first layer stack LST1 is an LTPS transistor in which the first active layer ACT1 is an LTPS semiconductor.

Referring to FIG. 12, some of the second transistors TR2 disposed in the second layer stack LST2 can be oxide transistors in which the second active layer ACT2 is an oxide semiconductor, and others thereof can be LTPS transistors in which the second active layer ACT2 is an LTPS semiconductor.

For example, the driving transistor DRT, in which high speed driving is required, can be implemented as an LTPS transistor, and the diving transistor, in which high speed driving is not required and uniformity is important, can be implemented as an oxide transistor.

The above-described oxide transistor can be an n-type or p-type transistor. That is, the oxide semiconductor can be an n-type oxide semiconductor or a p-type oxide semiconductor.

For example, the n-type oxide semiconductor can include at least one selected from indium zinc oxide (IZO), indium gallium zinc oxide (IGZO), and indium tin zinc oxide (ITZO). The p-type oxide semiconductor can include at least one selected from $CuO_x$, $SnO_x$, $NiO_x$, or the like.

Meanwhile, a multi-display device can be implemented by utilizing the above-described display panel 110 according to embodiments.

Figure 13:
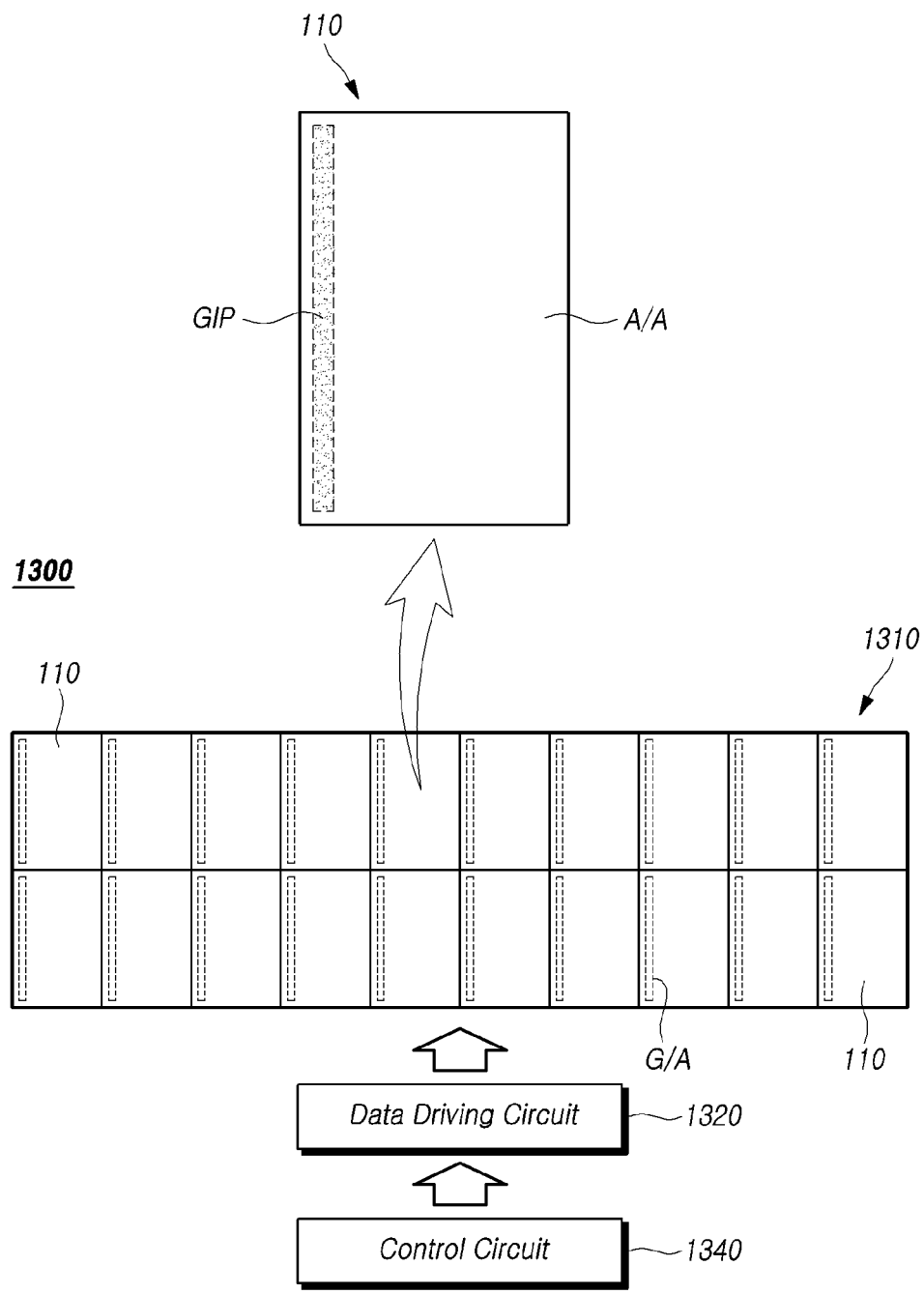
FIG. 13 illustrates a multi-display device according to embodiments.
Figure 14:
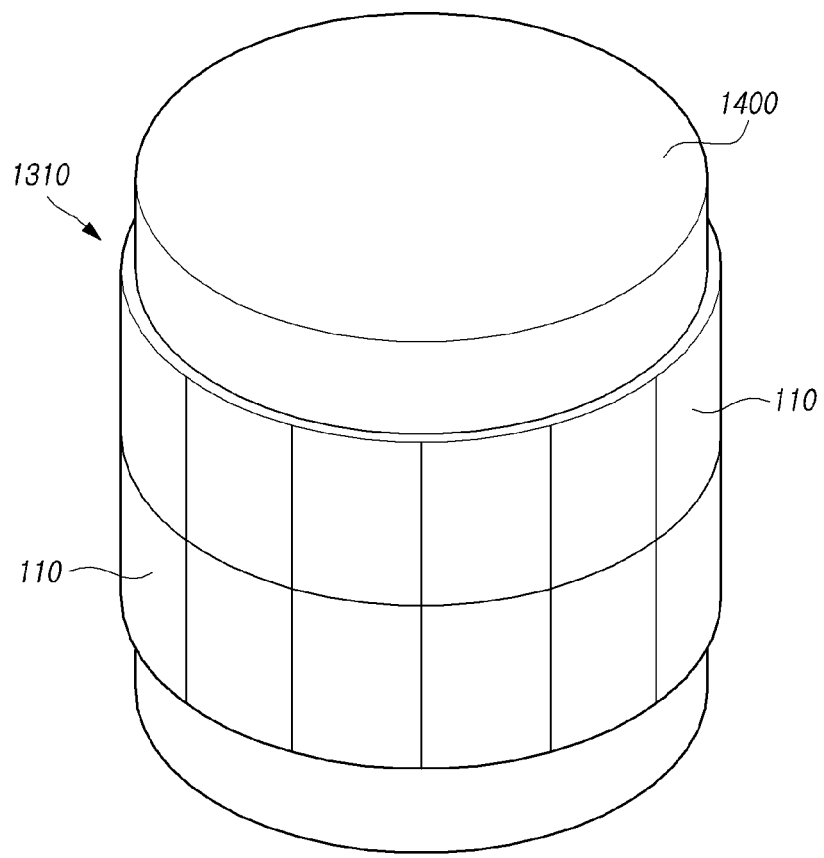
FIG. 14 illustrates an application of the multi-display device illustrated in FIG. 13, according to an embodiment.

FIG. 13 illustrates a multi-display device 1300 according to embodiments. FIG. 14 illustrates an application of the multi-display device 1300 illustrated in FIG. 13.

Referring to FIG. 13, the multi-display device 1300 according to embodiments is an application of the display device 100 including a plurality of display panels 110.

In the multi-display device 1300, the plurality of display panels 110 can function as independent displays and can also interwork with each other to function as a single display like a single display panel.

In this regard, a bezel area of each of the plurality of display panels 110 included in the multi-display device 1300 should be minimized.

The display panel 110 described above with reference to FIGS. 1 to 12 can have a structure in which the bezel area can be minimized or removed, thereby significantly assisting in implementation of the multi-display device 1300.

Referring to FIG. 13, the multi-display device 1300 according to embodiments can include a display 1310 including at least two display panels 110, a data driving circuit 1320 for driving data lines disposed in the at least two display panels 110, and a control circuit 1340 for controlling the data driving circuit 1320 and the like.

Since each of the at least two display panels 110 included in the display 1310 is the same as that described with reference to FIGS. 1 to 12, only a brief description will be given below.

Each of a plurality of display panels 110 included in the display unit 1310 can include a first plate PLT1, a first layer stack LST1, a second plate PLT2, a second layer stack LST2, and the like.

The second plate PLT2 is disposed on the first plate PLT1.

The first layer stack LST1 can be disposed between the first plate PLT1 and the second plate PLT2 and can include a plurality of layers. A metal material or an insulating material can be formed in each of the plurality of layers.

The second layer stack LST2 can be disposed on the second plate PLT2 and can include a plurality of layers. A metal material or an insulating material can be formed in each of the plurality of layers.

The first layer stack LST1 and the second layer stack LST2 are separated by the second plate PLT2.

A plurality of first transistors TR1 are disposed in the first layer stack LST1.

A plurality of second transistors TR2 are disposed in the second layer stack LST2.

The plurality of first transistors TR1 disposed in the first layer stack LST1 and the plurality of second transistors TR2 disposed in the second layer stack LST2 are separated by the second plate PLT2.

The plurality of first transistors TR1 can be disposed in the entire area of the first layer stack LST1 disposed between the first plate PLT1 and the second plate PLT2 or can be disposed in a certain area (for example, a peripheral area) of the first layer stack LST1.

The plurality of second transistors TR2 can be disposed in the entire area or a certain area of the second layer stack LST2 disposed on the second plate PLT2.

The plurality of second transistors TR2, constituting a plurality of subpixels SP arranged in an active area A/A corresponding to an image display area, can be disposed in the second layer stack LST2.

A gate driver 130 can be embedded in each of the plurality of display panels 110.

In this regard, a plurality of gate driving circuits GIP constituting the gate driver 130 can be formed in the first layer stack LST1.

The plurality of first transistors TR1 disposed in the first layer stack LST1 can be transistors constituting the plurality of gate driving circuits GIP.

The first transistor TR1 can be disposed to overlap an area of at least one subpixel SP of the plurality of subpixels SP. For example, the first transistor can be disposed to overlap an area of at least one pixel SP which is disposed a peripheral portion among the plurality of subpixels SP.

The data driving circuit 1320 can drive the entire data lines disposed in the plurality of display panels 110. The data driving circuit 1320 includes all data drivers 120 corresponding to the plurality of display panels 110.

In addition, as described above, the gate driver 130 can be embedded in each of the plurality of display panels 110.

The control circuit 1340 can control the data driver circuit 1320 and the gate driver 130 embedded in each of the plurality of display panels 110.

Thus, the plurality of display panels 110 can be independently displayed, or only some of the plurality of display panels 110 can be displayed.

In addition, small screens in which one screen is divided into a plurality of screens can be distributed and displayed on the plurality of display panels 110.

The above-described multi-display device 1300 can also be used as a signage device, e.g., a display installed in a public place or a commercial space.

When the multi-display device 1300 is used as a signage device, the display 1310 including the plurality of display panels 110 can be utilized as a flat large screen. For example, the multi-display device 1300 can be used as a large billboard or can be installed in a stadium, an exhibition hall, a performance hall, or the like to be used as a large screen.

Alternatively, when the multi-display device 1300 is used as a signage device, as shown in FIG. 14, the display 1310 including the plurality of display panels 110 can also be utilized as a large screen having a cylindrical shape, installed in a cylindrical structure 1400 (e.g., used around a column or pole, or a curved scoreboard in an a sports arena). For example, the cylindrical multi-display device 1300 can be used as a large billboard or can be installed in a stadium, an exhibition hall, a performance hall, or the like to be utilized as a large screen.

In this situation, in each of the plurality of display panels 110, the first plate PLT1 and the second plate PLT2 can be flexible plates.

As set forth above, according to embodiments, the display panel 110 and the display device 100 having a bezel-free structure are provided.

According to embodiments, the display panel 110 and the display device 100 have a structure able to improve element characteristics of an oxide transistor when the oxide transistor, as well as an LTPS transistor, are included.

According to embodiments, the display panel 110 and the display device 100 having a structure able to protect a transistor vulnerable to hydrogen are provided.

According to embodiments, the multi-display device 1300 including the display panels 110 having a bezel-free structure is provided.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A display panel comprising:
   a first plate;
   a second plate having a smaller width than the first plate and disposed on the first plate;
   a first layer stack disposed between the first plate and the secondplate;
   a first transistor disposed in agate driving circuit embedded in the display panel within the first layer stack;
   a second layer stack having the same width as the secondplate disposed on the secondplate;
   a second transistor disposed in each of a plurality of subpixels within the second layer stack; and
   a side routing line electrically connecting a first metal member disposed in the first layer stack with a second metal member disposed in the second layer stack, wherein the first transistor is disposed in a location overlapping with an area of at least one subpixel in an active area corresponding to an image display area, wherein the first transistor is a low temperature poly silicon transistor (LTPS), wherein the second transistor is an oxide transistor, wherein the second plate is a polyimide substrate as a hydrogen blocking plate configured to block hydrogen resulted from the low temperature poly silicon transistor (LTPS), wherein the side routing line is disposed along an outermost edge surface of the secondplate and an outermost edge surface of the second layer stack, wherein the outermost edge surfaces of the second plate and the second layer stack do not overlap with an outermost edge surface of the first plate and an outermost edge surface of the first layer stack in a bezel area at a periphery of the active area, wherein the side routing line has a first stepped portion in an area overlapping with the first metal member disposed in the first layer stack, and the first stepped portion is adjacent to the outermost edge surface of the first layer stack, and wherein a gate driving circuit area is vertically overlapped with a portion of the active area.

2. The display panel according to claim 1, wherein the first metal member is a source or drain electrode of the first transistor, or the first metal member corresponds to a pattern electrically connected to the source or drain electrode of the first transistor, and wherein the second metal member is a gate line electrically connected to a gate electrode of the second transistor, or the second metal member corresponds to a pattern electrically connected to the gate electrode of the second transistor.

3. The display panel according to claim 1, wherein the side routing line contacts an upper surface of the second metal member, a side surface of the second metal member and an upper surface of the first metal member.

4. The display panel according to claim 1, further comprising:

a second stepped portion at a side of the first layer stack, wherein the side routing line is disposed on the second stepped portion of the first layer stack.

5. The display panel according to claim 1, wherein the first layer stack includes at least one inorganic insulating film disposed between the first and second plates.

6. The display panel according to claim 1, wherein the first layer stack includes a bottom shield metal disposed below the first transistor, and wherein the bottom shield metal is electrically floated or is electrically connected to one of a source electrode, a drain electrode or a gate electrode of the first transistor.

7. The display panel according to claim 1, wherein the side routing line is further disposed along a portion of the first layer stack.

8. The display panel according to claim 1, wherein an upper portion of the side routing line directly contacts upper and side surfaces of the second metal member, and wherein a lower portion of the side routing line directly contacts upper and side surfaces of the first metal member.

9. The display panel according to claim 1, wherein the second metal member overlaps with the first metal member in a vertical direction.

10. The display panel according to claim 1, wherein the side routing line directly contacts the second metal member, the second plate, the first layer stack, the first metal member and the first plate.

11. The display panel according to claim 1, wherein the widths of the second plate and the second layer stack are narrower than widths of the first layer stack and the first plate.

12. A display device comprising:

a display including one or more display panels; and a data driving circuit for driving data lines disposed in the one or more display panels, wherein each of the one or more display panels includes:

a first plate;

a second plate having a smaller width than the first plate and disposed on the first plate;

a first layer stack disposed between the first plate and the secondplate;

a first transistor disposed in agate driving circuit embedded in the display panel within the first layer stack;

a second layer stack having the same width as the second plate disposed on the secondplate;

a second transistor disposed in each of a plurality of subpixels within the second layer stack; and a side routing line electrically connecting a first metal member disposed in the first layer stack with a second metal member disposed in the second layer stack, wherein the first transistor is disposed in a location overlapping with an area of at least one subpixel in an active area corresponding to an image display area, wherein the first transistor is a low temperature poly silicon transistor (LTPS), wherein the second transistor is an oxide transistor, wherein the second plate is a polyimide substrate as a hydrogen blocking plate configured to block hydrogen resulted from the low temperature poly silicon transistor (LTPS), wherein the side routing line is disposed along an outermost edge surface of the secondplate and an outermost edge surface of the second layer stack, wherein the outermost edge surfaces of the second plate and the second layer stack do not overlap with an outermost edge surface of the first plate and an outermost edge surface of the first layer s tack in a bezel area at a periphery of the active area, wherein the side routing line has a first stepped portion in an area overlapping with the first metal member disposed in the first layer stack, and the first stepped portion is adjacent to the outermost edge surface of the first layer stack, and wherein a gate driving circuit area is vertically overlapped with a portion of the active area.

13. The display device according to claim 12, wherein the display includes two or more display panels forming a cylindrical shape, and wherein the first plate and the second plate are flexible plates.

14. The display device according to claim 12, further comprising:

a second stepped portion at a side of the first layer stack, wherein the side routing line is disposed on the second stepped portion of the first layer stack.

15. The display device according to claim 12, wherein the side routing line contacts an upper surface of the second metal member, a side surface of the second metal member and an upper surface of the first metal member.

* * * * *